(12) United States Patent
Yoo et al.

(10) Patent No.: US 10,199,610 B2
(45) Date of Patent: Feb. 5, 2019

(54) DISPLAY APPARATUS HAVING MIRROR FUNCTION

(71) Applicant: SAMSUNG DISPLAY CO., LTD., Yongin, Gyeonggi-Do (KR)

(72) Inventors: Heesoo Yoo, Yongin (KR); Mugyeom Kim, Yongin (KR); Junggun Nam, Yongin (KR)

(73) Assignee: Samsung Display Co., Ltd., Yongin, Gyeonggi-do (KR)

( * ) Notice: Subject to any disclaimer, the term of this patent is extended or adjusted under 35 U.S.C. 154(b) by 0 days.

(21) Appl. No.: 14/596,533

(22) Filed: Jan. 14, 2015

(65) Prior Publication Data

US 2016/0056415 A1   Feb. 25, 2016

(30) Foreign Application Priority Data

Aug. 19, 2014   (KR) .................. 10-2014-0107759

(51) Int. Cl.
| | | |
|---|---|---|
| *G02F 1/1335* | (2006.01) | |
| *H01L 51/52* | (2006.01) | |
| *H01L 27/12* | (2006.01) | |
| *H01L 27/32* | (2006.01) | |

(52) U.S. Cl.
CPC .... *H01L 51/5284* (2013.01); *G02F 1/133553* (2013.01); *H01L 27/1214* (2013.01); *H01L 51/5281* (2013.01); *G02F 2001/133548* (2013.01); *G02F 2203/62* (2013.01); *H01L 27/322* (2013.01); *H01L 27/3232* (2013.01); *H01L 27/3244* (2013.01); *H01L 51/5259* (2013.01); *H01L 51/5271* (2013.01)

(58) Field of Classification Search
CPC .................. H01L 51/5284; G02F 1/133553
See application file for complete search history.

(56) References Cited

U.S. PATENT DOCUMENTS

| | | | |
|---|---|---|---|
| 2006/0158110 A1 | 7/2006 | Kim et al. | |
| 2008/0117368 A1* | 5/2008 | Chang | G02F 1/133512 349/106 |
| 2008/0218064 A1* | 9/2008 | Cho | H01L 27/322 313/504 |
| 2009/0236981 A1* | 9/2009 | Chang | H01L 51/5253 313/504 |
| 2010/0039692 A1* | 2/2010 | Yamada | G02F 1/1523 359/273 |

(Continued)

FOREIGN PATENT DOCUMENTS

| | | |
|---|---|---|
| JP | 2010-243769 | 10/2010 |
| KR | 10-2006-0057433 | 5/2006 |

(Continued)

*Primary Examiner* — Edmond Lau
(74) *Attorney, Agent, or Firm* — Lee & Morse, P.C.

(57) ABSTRACT

A display apparatus includes a display layer, an encapsulation layer, and a reflective layer. The display layer is on a substrate and includes a non-emission area adjacent to an emission area. The encapsulation layer is over the display layer. The reflective layer is on the encapsulation layer and includes a first opening corresponding to the emission area and a reflecting area adjacent the first opening and corresponding to the non-emission area. The reflective layer transmits light in a first mode and reflects light in a second mode different from the first mode.

20 Claims, 7 Drawing Sheets

(56) References Cited

U.S. PATENT DOCUMENTS

| | | | |
|---|---|---|---|
| 2010/0201609 A1 | 8/2010 | Kim | |
| 2012/0241796 A1* | 9/2012 | Naito | H01L 27/3232 257/98 |
| 2013/0001601 A1* | 1/2013 | Lee | H01L 51/5203 257/88 |

FOREIGN PATENT DOCUMENTS

| | | |
|---|---|---|
| KR | 10-2009-0099744 | 9/2009 |
| KR | 10-2009-0102113 A | 9/2009 |
| KR | 10-2010-0082211 A | 7/2010 |
| KR | 10-2010-0090448 | 8/2010 |

* cited by examiner

DISPLAY APPARATUS HAVING MIRROR FUNCTION

CROSS-REFERENCE TO RELATED APPLICATION

Korean Patent Application No. 10-2014-0107759, filed on Aug. 19, 2014, and entitled: "Display Apparatus Having Mirror Function," is incorporated by reference herein in its entirety.

BACKGROUND

1. Field

One or more embodiments described herein relate to a display apparatus having a mirror function.

2. Description of the Related Art

Flat panel displays are large, thin, and lightweight. Examples include liquid crystal displays, plasma display panels, and organic light-emitting displays.

SUMMARY

In accordance with one embodiment, a display apparatus includes a substrate, a display on the substrate and including a non-emission area adjacent to an emission area, an encapsulation layer over the display, and a reflective layer on the encapsulation layer and including a first opening corresponding to the emission area and a reflecting area adjacent the first opening and corresponding to the non-emission area, the reflective layer to transmit light in a first mode and to reflect light in a second mode different from the first mode.

The display apparatus may include a light-absorbing layer on the encapsulation layer, wherein the light-absorbing layer includes a second opening that corresponds to the emission area and a light-absorbing area adjacent the second opening and that corresponds to the non-emission area. A width of the first opening may be less than or equal to a width of the second opening. The reflective layer may be on a first surface opposite to a second surface of the encapsulation layer that faces the display, and the light-absorbing layer may be on the second surface of the encapsulation layer that faces the display.

The display apparatus may include a color filter in the second opening. The display may include a plurality of pixels to emit white light. The display apparatus may include a wire grid polarizer in the second opening. The reflective layer may include a switching layer that includes: an alloy of magnesium (Mg) and at least one of calcium (Ca), strontium (Sr), or barium (Ba), and a catalyst layer to perform hydrogenation or dehydrogenation in the switching layer.

The display may include a plurality of pixels to emit different colors of light. Each of the pixels may include a first electrode electrically connected to a thin-film transistor to drive the pixel; a second electrode facing the first electrode; and an intermediate layer between the first electrode and the second electrode and including an organic emission layer.

Each of the pixels may include a pixel electrode electrically connected to a thin-film transistor to drive the pixel; a common electrode facing the pixel electrode; and a liquid crystal layer between the pixel electrode and the common electrode.

In accordance with another embodiment, a display apparatus includes a substrate, a display on the substrate and including a non-emission area adjacent to an emission area, a light-absorbing layer on the display and corresponding to the non-emission area, and a reflective layer on the light-absorbing layer and planarly overlapping the light-absorbing layer, the reflective layer to transmit light in a first mode and to reflect light in a second mode.

The display apparatus may include an encapsulation layer between the light-absorbing layer and the reflective layer and facing the substrate. The reflective layer and the light-absorbing layer may respectively include a first opening and a second opening that correspond to the emission area, and a width of the first opening may be less than or equal to a width of the second opening.

The display apparatus may include a color filter on the display and corresponding to the emission area. The display apparatus may include a wire grid polarizer on the display and corresponding to the emission area. The reflective layer may include a switching layer that includes: an alloy of magnesium (Mg) and at least one of calcium (Ca), strontium (Sr), or barium (Ba), and a catalyst layer to perform hydrogenation or dehydrogenation in the switching layer.

The display may include a first electrode, a second electrode facing the first electrode, and an intermediate layer between the first electrode and the second electrode and including an organic emission layer. The display may include a pixel electrode, a common electrode facing the pixel electrode, and a liquid crystal layer between the pixel electrode and the common electrode.

In accordance with another embodiment, a display apparatus may include a display layer including a non-emission area and an emission area, an encapsulation layer over the display layer, and a reflective layer on the encapsulation layer, wherein the reflective layer includes a first opening corresponding to the emission area and a reflecting area adjacent the first opening and corresponding to the non-emission area, the reflective layer to transmit light in a display mode and to reflect light in a mirror mode.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
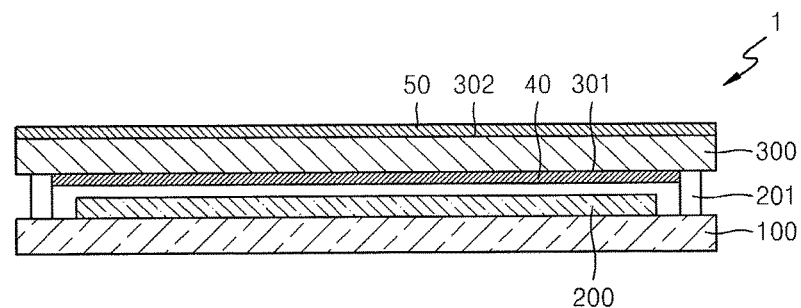
FIG. 1 illustrates an embodiment of a display apparatus.

Example embodiments are described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawings, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Figure 2:
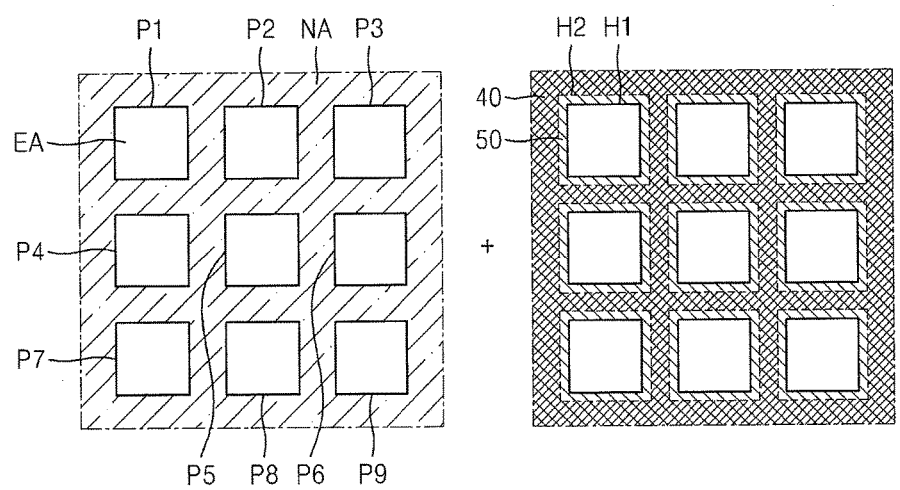
FIG. 2 illustrates a portion of the display apparatus.
Figure 3:
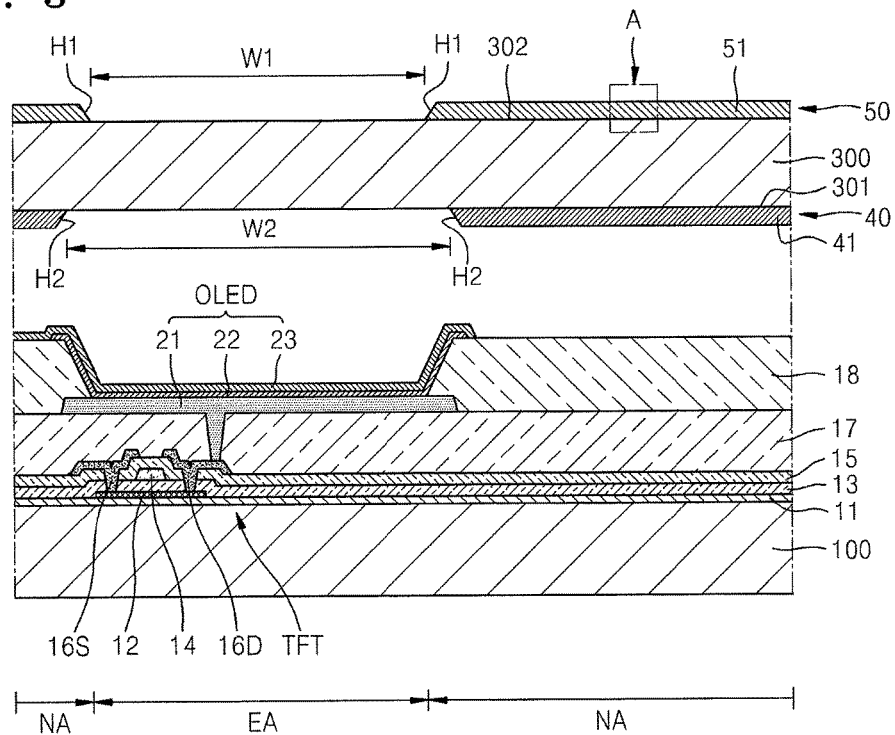
FIG. 3 illustrates an embodiment of a pixel.

FIG. 1 is a cross-sectional view of one embodiment of a display apparatus 1. FIG. 2 is a plan view of a portion of the display apparatus 1. FIG. 3 is a magnified cross-sectional view of one embodiment of a pixel, which, for example, may be in the display apparatus 1.

Referring to FIGS. 1 through 3, the display apparatus 1 includes a substrate 100, a display unit 200 on the substrate 100 and having an emission area EA and a non-emission area NA adjacent to (e.g., surrounds) the emission area EA, and an encapsulation member 300 facing the substrate 100 with display unit 200 therebetween. The encapsulation member or layer 300 encapsulates the substrate 100 and display unit 200, and thus protects display unit 200 from exterior oxygen or moisture.

A sealant 201 bonds the substrate 100 and the encapsulation member 300. An absorbent and/or a filling member may be arranged in a space between the substrate 100 and the encapsulation member 300 formed by the sealant 201.

The substrate 100 may be, for example, a transparent glass substrate or a plastic substrate. The encapsulation member 300 may include the same material (e.g., transparent glass or plastic) as the substrate 100 or a different material.

The display unit 200 includes the emission area EA and the non-emission area NA. The emission area EA includes a plurality of pixels P1 through P9 that respectively emit light of predetermined colors to form an image.

A light-absorbing layer 40 may be on a second surface 301 of the encapsulation member 300 which faces the display unit 200. A reflective member or layer 50 may be on a first surface 302 of the encapsulation member 300.

The reflective member 50 includes a first opening H1 that corresponds to the emission area EA, and a reflecting part 51 that surrounds the first opening H1 in correspondence with the non-emission area NA. The reflective member 50 and/or the reflecting part 51 transmits or reflects light based on the mode of operation. For example, the reflective member 50 may switch between or among these modes.

The light-absorbing layer 40 includes a second opening H2 that corresponds to the emission area EA, and a light-absorbing part 41 that surrounds the second opening H2 in correspondence with the non-emission area NA. An area of the first opening H1 may be equal to or less than an area of the second opening H2. In one embodiment, the light-absorbing layer 40 may be completely covered in a planar manner by the reflective member 50.

FIG. 3 illustrates an example of a structure of the display unit 200. This structure includes a buffer layer 11 (which may be formed as a single layer or multiple layers including silicon nitride ($SiN_x$) and silicon oxide ($SiO_x$) on the substrate 100. A thin-film transistor TFT including an active layer 12, a gate electrode 14, a source electrode 16S, and a drain electrode 16D may be on the buffer layer 11.

A gate insulating layer 13 is between the active layer 12 and the gate electrode 14. An interlayer insulating layer 15 is on the gate electrode 14. The gate insulating layer 13 and the interlayer insulating layer 15 may be formed as a single layer or multiple layers including silicon nitride ($SiN_x$) and silicon oxide ($SiO_x$) or may include an organic material.

The active layer 12 may include inorganic semiconductor such as amorphous silicon or crystalline silicon, an oxide semiconductor, or an organic semiconductor, and may include a source region, a drain region, and a channel region. The source and drain regions of the active layer 12 may be formed in a manner such that an amorphous silicon layer or a crystalline silicon layer is formed and then is doped with an impurity.

The gate electrode 14 includes, for example, at least one metal including but not limited to aluminum (Al), platinum (Pt), palladium (Pd), silver (Ag), magnesium (Mg), gold (Au), nickel (Ni), neodymium (Nd), iridium (Ir), chrome (Cr), lithium (Li), calcium (Ca), molybdenum (Mo), titanium (Ti), tungsten (W), and copper (Cu), and may be formed as triple layers of Ti/Al/Ti or Mo/Al/Mo.

The source electrode 16S and the drain electrode 16D may be electrically connected to the source region and the drain region of the active layer 12, respectively, via contact holes formed through the interlayer insulating layer 15 and the gate insulating layer 13. Similar to the gate electrode 14, each of the source electrode 16S and the drain electrode 16D may include at least one metal including but not limited to aluminum (Al), platinum (Pt), palladium (Pd), silver (Ag), magnesium (Mg), gold (Au), nickel (Ni), neodymium (Nd), iridium (Ir), chrome (Cr), lithium (Li), calcium (Ca), molybdenum (Mo), titanium (Ti), tungsten (W), and copper (Cu), and may be formed as triple layers of Ti/Al/Ti or Mo/Al/Mo.

A passivation layer 17 covers and may be on the thin-film transistor TFT. The passivation layer 17 may include a via hole that exposes a portion of the drain electrode 16D. A first electrode 21 of an organic light-emitting device OLED may be electrically connected to the drain electrode 16D through the via hole. For example, the first electrode 21 may be electrically connected to the thin-film transistor TFT that drives the pixel.

The organic light-emitting device OLED may be disposed on the passivation layer 17, and may include the first electrode 21, an intermediate layer 22 including an organic emission layer (organic EML), and a second electrode 23.

The first electrode 21 may have an island form that is separate in each of the pixels P1 through P9. A pixel-defining layer 18 may be on the passivation layer 17, for example, to cover side portions of the first electrode 21.

The first electrode 21 may be a reflective electrode including a reflective layer. For example, the reflective layer may include at least one of silver (Ag), magnesium (Mg), aluminum (Al), platinum (Pt), palladium (Pd), gold (Au), nickel (Ni), neodymium (Nd), iridium (Ir), and chrome (Cr), and a transparent or translucent electrode layer including at least one selected from the group consisting of indium tin oxide (ITO), indium zinc oxide (IZO), zinc oxide (ZnO), indium oxide ($In_2O_3$), indium gallium oxide (IGO), or aluminum zinc oxide (AZO), and may be arranged on the reflective layer. In one embodiment, the first electrode 21 may be formed as triple layers of ITO/Ag/ITO.

The intermediate layer 22 may include the organic EML, and may include at least one of a hole injection layer (HIL), a hole transport layer (HTL), an electron transport layer (ETL), or an electron injection layer (EIL). In another embodiment, the intermediate layer 22 may include one or more different or additional functional layers.

The organic EML in the intermediate layer 22 may include an organic material that emits one or more predetermined colors (e.g., green, red, or blue) of light.

The second electrode 23 may be a transparent or translucent electrode, may include at least one of silver (Ag), aluminum (Al), magnesium (Mg), lithium (Li), calcium (Ca), copper (Cu), LiF/Ca, LiF/Al, MgAg, and CaAg, and may be formed as a thin layer having a thickness of several to several tens of nanometers (nm).

The encapsulation member 300 may be on the organic light-emitting device OLED, the light-absorbing layer 40 may be on the second surface 301 of the encapsulation member 300 which faces the display unit 200 (refer to FIG. 1), and the reflective member 50 may be on the first surface 302 of the encapsulation member 300, which is an opposite surface of the second surface 301 of the encapsulation member 300 which faces the display unit 200 (refer to FIG. 1).

The reflective member 50 includes the first opening H1 that corresponds to the emission area EA and the reflecting part 51 that surrounds the first opening H1 so as to correspond to the non-emission area NA. The light-absorbing layer 40 includes the second opening H2 that corresponds to the emission area EA and the light-absorbing part 41 that surrounds the second opening H2 so as to correspond to the non-emission area NA. The reflecting part 51 and the light-absorbing part 41 may planarly overlap each other. A width W1 of the first opening H1 may be less than or equal to a width W2 of the second opening H2.

The reflective member 50 is a switchable reflective member 50 that transmits or reflects light according to the mode of operation. For example, the reflective member 50 may transmit light in a display mode (in which light is emitted from the organic light-emitting device OLED and thus an image is displayed), and the reflective member 50 may reflect external light in a mirror mode (in which an image is not displayed, and thus may allow the display apparatus 1 to function as a mirror). Thus, the reflective member 50 may be reversibly switched between a transmitting state and a reflective state.

If the reflective member 50 reflects light in the display mode, a contrast of a displayed image may deteriorate. However, in the present embodiment, the display apparatus 1 employs the switchable reflective member 50 and thus does not reflect light in the display mode, so that image contrast may be improved. Here, light that passes through the reflective member 50 may be absorbed by the light-absorbing layer 40 that planarly overlaps the reflective member 50. That is, since the light-absorbing layer 40 is so arranged, external light may not be reflected by electrodes or wires in the display apparatus 1.

In the mirror mode, the reflective member 50 may reflect external light and thus the display apparatus 1 may function as a mirror. Also, since the width W2 of the second opening H2 of the light-absorbing layer 40 is equal to or greater than the width W1 of the first opening H1 of the reflective member 50, the light-absorbing layer 40 may be completely covered in a planar manner by the reflective member 50. Thus, in the mirror mode, the light-absorbing layer 40 may not be visible due to the reflective member 50.

Figure 4:
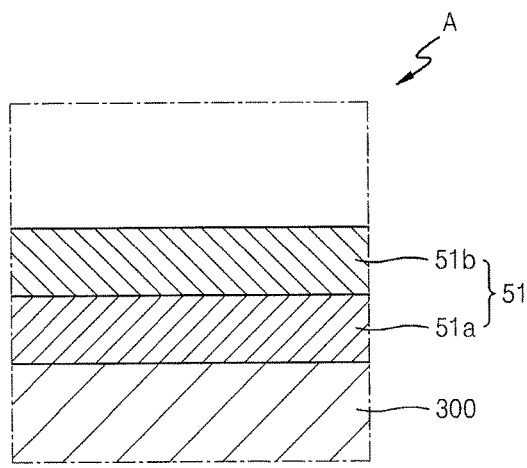
FIG. 4 illustrates a magnified cross-sectional view of the pixel.

FIG. 4 is a magnified cross-sectional view of a portion A in FIG. 3. Referring to FIG. 4, the reflecting part 51 in the reflective member 50 of FIG. 3 may include a switchable layer 51a and a catalyst layer 51b that promotes hydrogenation or dehydrogenation in the switchable layer 51a.

Transmittance of the switchable layer 51a may be changed according to degrees of hydrogenation. Thus, when the switchable layer 51a is hydrogenated, the transmittance of the switchable layer 51a may be increased so that the reflective member 50 transmits external light. When the switchable layer 51a is dehydrogenated, reflectance of the switchable layer 51a may be increased so that the reflective member 50 reflects external light.

The switchable layer 51a may include a material having a transmittance that changes according to hydrogenation and dehydrogenation. For example, the switchable layer 51a may be formed of an alloy of magnesium (Mg) and at least one metal including but not limited to calcium (Ca), strontium (Sr), or barium (Ba). In another embodiment, the switchable layer 51a may include an alloy of magnesium (Mg) and a different transition element such as nickel (Ni) or titanium (Ti). In one application application, the thickness of the switchable layer 51a may be between about 10 nm and about 200 nm. If the thickness is less than 10 nm, the reflectance may not be sufficiently high in the dehydrogenation. If the thickness is equal to or greater than 200 nm, the transmittance may not be sufficiently high in the hydrogenation. Nevertheless, the thickness may be less than 10 nm or greater than 200 nm in alternative embodiments.

The catalyst layer 51b may be on the switchable layer 51a, may promote hydrogenation and dehydrogenation of the switchable layer 51a, and thus may decrease a switching time between the transmitting state and the reflective state. The catalyst layer 51b may include, for example, one or more of palladium (Pd), platinum (Pt), a palladium alloy, or a platinum alloy.

Various methods may be used to hydrogenate or dehydrogenate the switchable layer 51a. For example, the switchable layer 51a and the catalyst layer 51b may be encapsulated by glass or the like, and hydrogen may be supplied into an encapsulated space in order to hydrogenate the switchable layer 51a. Oxygen or air may be supplied into the encapsulated space in order to dehydrogenate the switchable layer 51a.

In another embodiment, an electrolyte solution layer including, for example, a sodium hydroxide aqueous solution or the like may be disposed on the catalyst layer 51b. A voltage may be applied to the electrolyte solution layer in order to hydrogenate the switchable layer 51 or dehydrogenate this layer according to a direction of an electric field. An electrode may apply the voltage to the electrolyte solution layer.

Figure 5A:
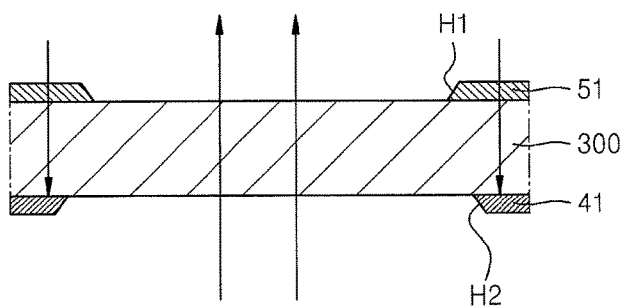
FIGS. 5A and 5B are examples of light paths in display and mirror modes.
Figure 5B:
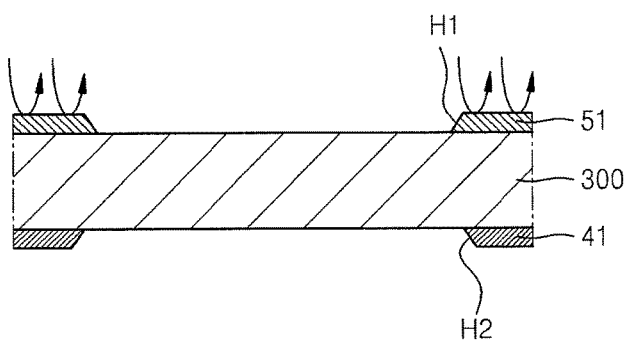

FIGS. 5A and 5B conceptually illustrates examples of light paths in display and mirror modes, respectively. Referring to FIG. 5A, in the display mode, light emitted from the organic light-emitting device OLED (refer to FIG. 3) is externally emitted to display an image. The reflecting part 51 in the reflective member 50 (refer to FIG. 3) may transmit external light, and the transmitted light may be absorbed by the light-absorbing part 41 in the light-absorbing layer 40 (refer to FIG. 3.).

For example, in the display mode, light may not be reflected by the reflecting part 51 so that the contrast of a realized image may not deteriorate. Also, external light that passes through the reflecting part 51 may be absorbed by the light-absorbing part 41, so that reflection of the external light may be prevented and, thus, visibility of the display apparatus 1 may be further improved.

Referring to FIG. 5B, in the mirror mode, light may not be emitted from the organic light-emitting device OLED and the reflecting part 51 reflects external light. As a result, the display apparatus 1 functions as a mirror.

Here, the width W1 of the first opening H1 in the reflective member 50 may be less than or equal to the width W2 of the second opening H2 in the light-absorbing layer 40. In one embodiment, the width W1 of the first opening H1 may be less than the width W2 of the second opening H2.

Thus, the light-absorbing layer 40 may be completely covered by the reflective member 50 and, thus, may not be visible in the mirror mode.

Figure 6:
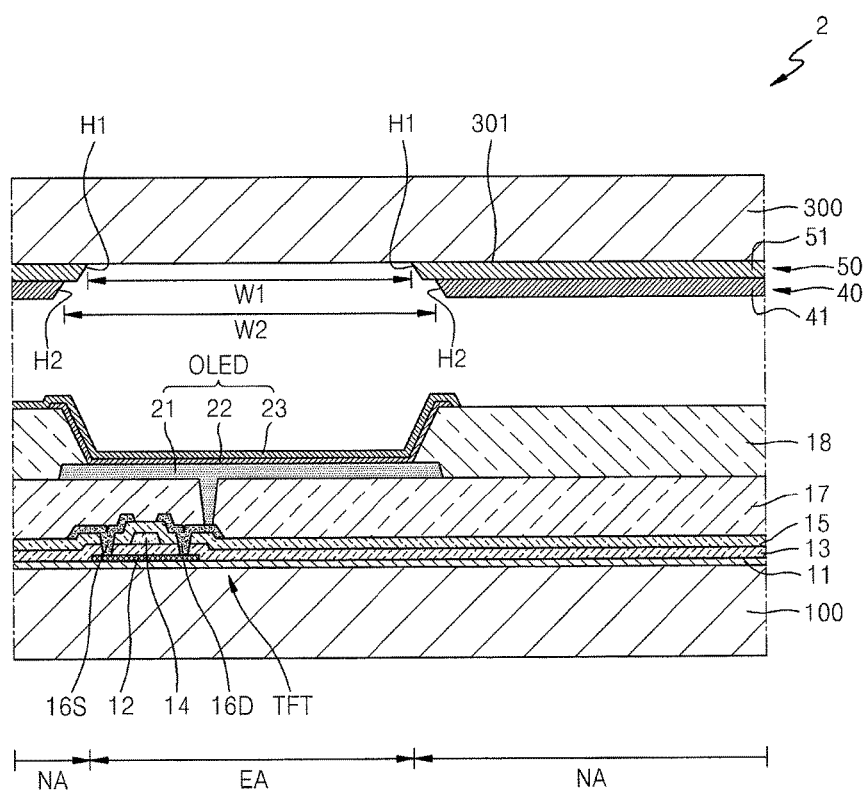
FIGS. 6 to 9 illustrate additional embodiments of a display apparatus.

FIGS. 6 to 9 are cross-sectional views of additional embodiments of display apparatuses 2 through 5. Referring to FIG. 6, the display apparatus 2 includes a light-absorbing layer 40 and a switchable reflective member 50 on the second surface 301 of an encapsulation member 300, which faces an organic light-emitting device OLED, and that transmits or reflects light according to the mode of operation. For example, the reflective member 50 may contact the second surface 301 of the encapsulation member 300, and the light-absorbing layer 40 may be below the reflective member 50.

The reflective member 50 includes a first opening H1 that corresponds to an emission area EA, and a reflecting part 51 that surrounds the first opening H1 that corresponds to a non-emission area NA. The light-absorbing layer 40 includes a second opening H2 that corresponds to the emission area EA, and a light-absorbing part 41 that surrounds the second opening H2 that corresponds to the non-emission area NA. A width W1 of the first opening H1 may be less than or equal to a width W2 of the second opening H2.

Figure 7:
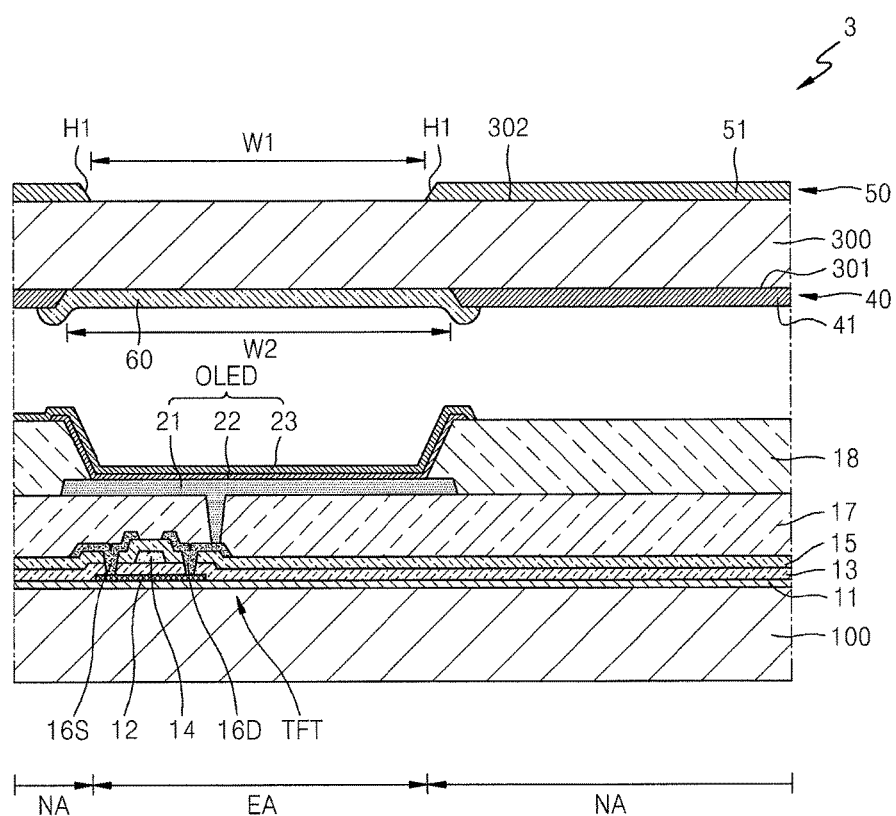

Referring to FIG. 7, the display apparatus 3 includes a color filter 60 that corresponds to the emission area EA of the display apparatus 1 of FIG. 3. For example, the color filter 60 may be in a second opening H2 in a light-absorbing layer 40.

An organic light-emitting device OLED includes a first electrode 21 electrically connected to a thin-film transistor TFT, a second electrode 23 that faces the first electrode 21, and an intermediate layer 22 between the first electrode 21 and the second electrode 23 and including an organic EML.

The organic EML in the intermediate layer 22 may emit light of a predetermined color or combination of colors, e.g., white. For example, the organic EML may have a structure in which a red light-emitting material, a green light-emitting material, and a blue light-emitting material are stacked, or may have a structure in which the red light-emitting material, the green light-emitting material, and the blue light-emitting material are mixed. In another embodiment, different colors, or combinations of colors, may be used, including but not limited to combinations that produce white light.

The display apparatus 3 that includes an organic EML that emits white light does not have a color interference problem that may generally occur among pixels for emitting light with different colors. As a result, the defect rate of such an embodiment may be small and productivity may be high.

The color filter 60 that corresponds to the emission area EA may absorb light that corresponds to a range of a wavelength from among wavelengths of the white light emitted from the organic light-emitting device OLED. Thus a particular color may be assigned to the light emitted from the organic light-emitting device OLED.

Figure 8:
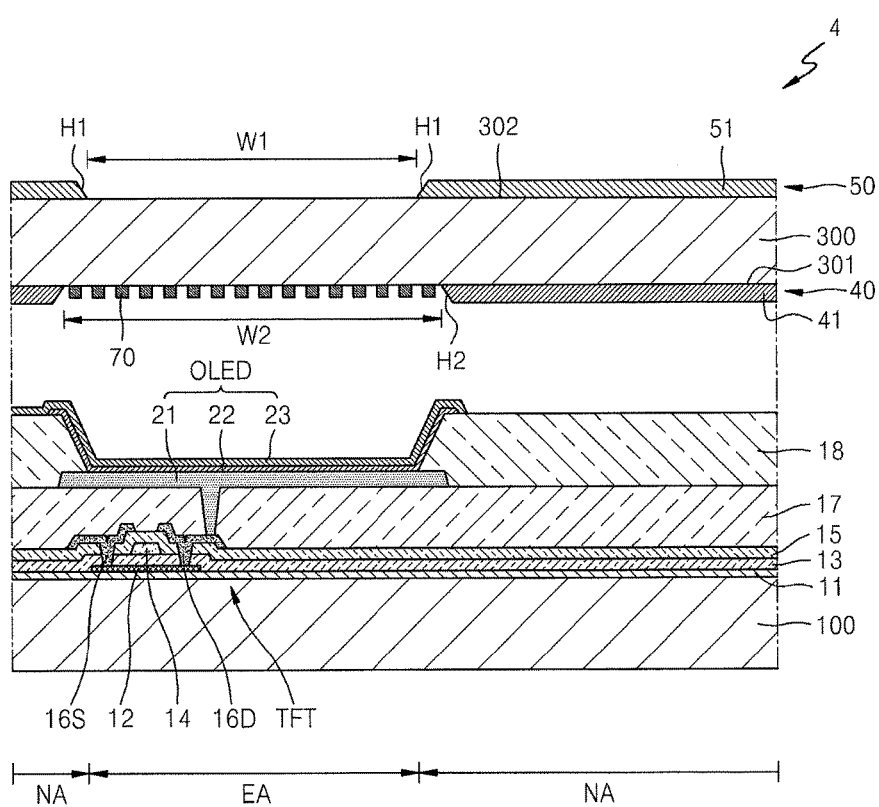

Referring to FIG. 8, the display apparatus 4 may include a wire grid polarizer 70 that corresponds to the emission area EA of the display apparatus 1 of FIG. 3. For example, the wire grid polarizer 70 may be in a second opening H2 in a light-absorbing layer 40.

The wire grid polarizer 70 indicates an array of fine metallic wires arranged in parallel, and functions to transmit or reflect only particular polarized-light of an electromagnetic wave. The wire grid polarizer 70 may have an excellent or predetermined polarized light separating ability in a visible-light range. Light that does not pass through the wire grid polarizer 70 may be reflected by the wire grid polarizer 70. The light reflected by the wire grid polarizer 70 may be re-incident on an organic light-emitting device OLED, and a portion of the re-incident light may be reflected by a second electrode 23 and, thus, may be externally emitted or may be reflected again.

Thus, in the display apparatus 4 of the present embodiment, the wire grid polarizer 70 is disposed in an area corresponding to the emission area EA, so that an efficiency of light discharged from the display apparatus 4 may be improved.

Figure 9:
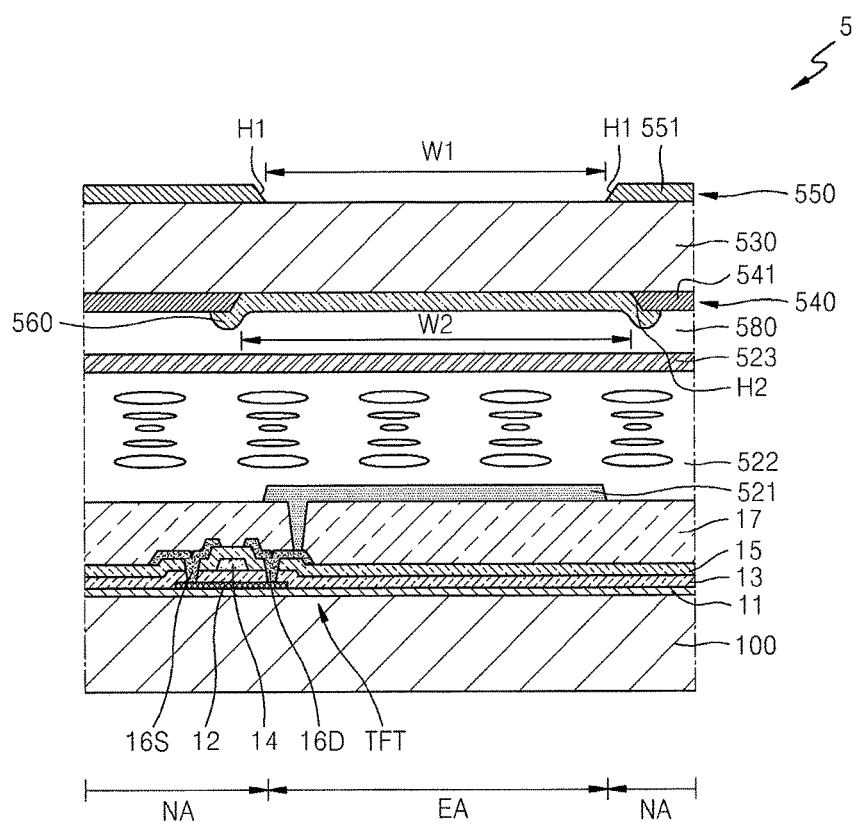

Referring to FIG. 9, the display apparatus 5 may be a liquid crystal display apparatus which includes a pixel electrode 521 electrically connected to a thin-film transistor TFT, a common electrode 523 that faces the pixel electrode 521, and a liquid crystal layer 522 between the pixel electrode 521 and the common electrode 523.

The liquid crystal layer 522 is between the pixel electrode 521 and the common electrode 523. When a voltage is applied to the pixel electrode 521 and the common electrode 523, the orientation of liquid crystals in the liquid crystal layer 522 is controlled to block or transmit light from a backlight. The pixel electrode 521 may be on a passivation layer 17, may be electrically connected to a drain electrode 16D through a via hole included in the passivation layer 17, and may include a transparent conductive material.

Similar to the substrate 100, an encapsulation member 530 may be a transparent glass substrate or plastic substrate. A color filter 560 that corresponds to an emission area EA and a light-absorbing layer 540 that corresponds to a non-emission area EA may be on a surface of the encapsulation member 530 which faces the pixel electrode 521.

The color filter 560 may include a photosensitive organic material, and may filter a color to light from the backlight passing through a liquid crystal layer 522. The light-absorbing layer 540 may prevent a crosstalk and color interference between light after passing through the color filter 560.

An over coating layer 580 may cover the color filter 560 and the light-absorbing layer 540, may include a material such as acryl-based epoxy, and may protect the color filter 560. A common electrode 523 may be on the over coating layer 580 and may include a transparent conductive material. The common electrode 523 and the pixel electrode 521 may directly apply a voltage to the liquid crystal layer 522.

A reflective member 550 includes a first opening H1 that corresponds to the emission area EA and a reflecting part 551 that surrounds the first opening H1 that corresponds to the non-emission area NA, and may be arranged on a first surface opposite to a second surface of the encapsulation member 530 which faces the pixel electrode 521. The light-absorbing layer 540 may include a second opening H2 that corresponds to the emission area EA and a light-absorbing part 541 that surrounds the second opening H2 that corresponds to the non-emission area NA.

A reflective member 550 may be switchable in order to transmit or reflect light according to the mode of operation. In a display mode (in which light is emitted from the organic light-emitting device OLED to display an image), the reflective member 550 may transmit the light. In a mirror mode (in which an image is not displayed), the reflective member 550 may reflect external light to allow the display apparatus 5 to function as a mirror.

In the display mode, because the reflective member 550 does not reflect external light, image contrast may be improved. Here, the light that passes through the reflective member 550 may be absorbed by the light-absorbing layer 540 that planarly overlaps the reflective member 550.

According to one or more of the aforementioned embodiments, the display apparatus may switch between a mirror mode and a display mode, and may have improved contrast when operating in display mode.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise indicated. Accordingly, it will be understood by those of skill in the art that various changes in form and details may be made without departing from the spirit and scope of the present invention as set forth in the following claims.

What is claimed is:

1. A display apparatus, comprising:
   a substrate;
   a display layer on the substrate and including a non-emission area adjacent to an emission area;
   an encapsulation layer over the display layer;
   a light-absorbing layer on the encapsulation layer; and
   a reflective layer on the encapsulation layer and including
      a first opening corresponding to the emission area and
      a reflecting area adjacent the first opening and corresponding to the non-emission area,
   wherein the light-absorbing layer has a second opening planarly overlapping the first opening in the reflective layer corresponding to the emission area, and
   wherein the reflective layer is to transmit light in a first mode in which the emission area emits light and to reflect light in a second mode different from the first mode, wherein,
   the reflective layer is disposed on a first surface of the encapsulation layer and the light-absorbing layer disposed on a second surface of the encapsulation layer opposite the first surface,
   in the first mode, the light emitted from the emission area to the outside passes through the second opening of the light-absorbing layer, the encapsulation layer, and the first opening of the reflective layer sequentially, and
   in the second mode, external light is reflected in a direction away from the display layer such that the only reflected light observed by a viewer is light that is external to the display layer.

2. The display apparatus as claimed in claim 1, wherein the light-absorbing layer includes a light-absorbing area adjacent the second opening and that corresponds to the non-emission area.

3. The display apparatus as claimed in claim 1, further comprising: a color filter in the second opening.

4. The display apparatus as claimed in claim 3, wherein the display layer includes a plurality of pixels to emit white light.

5. The display apparatus as claimed in claim 1, further comprising: a wire grid polarizer in the second opening.

6. The display apparatus as claimed in claim 2, wherein:
   the reflective layer is on a first surface opposite to a second surface of the encapsulation layer that faces the display layer, and
   the light-absorbing layer is on the second surface of the encapsulation layer that faces the display layer.

7. The display apparatus as claimed in claim 1, wherein the reflective layer includes a switching layer that includes:
   an alloy of magnesium (Mg) and at least one of calcium (Ca), strontium (Sr), or barium (Ba), and
   a catalyst layer to perform hydrogenation or dehydrogenation in the switching layer.

8. The display apparatus as claimed in claim 1, wherein the display layer includes a plurality of pixels to emit different colors of light.

9. The display apparatus as claimed in claim 8, wherein each of the pixels includes:
   a first electrode electrically connected to a thin-film transistor to drive the pixel;
   a second electrode facing the first electrode; and
   an intermediate layer between the first electrode and the second electrode and including an organic emission layer.

10. The display apparatus as claimed in claim 8, wherein each of the pixels includes:
    a pixel electrode electrically connected to a thin-film transistor to drive the pixel;
    a common electrode facing the pixel electrode; and
    a liquid crystal layer between the pixel electrode and the common electrode.

11. The display apparatus as claimed in claim 1, wherein:
    a width of the first opening is less than or equal to a width of the second opening.

12. A display apparatus, comprising:
    a substrate;
    a display layer on the substrate and including a non-emission area adjacent to an emission area;
    a light-absorbing layer on the display and corresponding to the non-emission area;
    a reflective layer on the light-absorbing layer and planarly overlapping the light-absorbing layer, wherein the light-absorbing layer has a second opening planarly overlapping a first opening in the reflective layer, the first opening and the second opening corresponding to the emission area; and
    an encapsulation layer over the display layer, wherein the reflective layer is to transmit light in a first mode in which the emission area emits light and to reflect light in a second mode, wherein,
    the reflective layer is disposed on a first surface of the encapsulation layer and the light-absorbing layer is disposed on a second surface of the encapsulation layer opposite the first surface,
    in the first mode, the light emitted from the emission area to the outside passes through the second opening of the light-absorbing layer, the encapsulation layer, and the first opening of the reflective layer sequentially, and
    in the second mode, external light is reflected in a direction away from the display layer such that the only reflected light observed by a viewer is light that is external to the display layer.

13. The display apparatus as claimed in claim 12, wherein:
    a width of the first opening is less than or equal to a width of the second opening.

14. The display apparatus as claimed in claim 12, further comprising:
    a color filter on the display layer and corresponding to the emission area.

15. The display apparatus as claimed in claim 12, further comprising:
    a wire grid polarizer on the display layer and corresponding to the emission area.

16. The display apparatus as claimed in claim 12, wherein the reflective layer includes a switching layer that includes:

an alloy of magnesium (Mg) and at least one of calcium (Ca), strontium (Sr), or barium (Ba), and a catalyst layer to perform hydrogenation or dehydrogenation in the switching layer.

17. The display apparatus as claimed in claim 12, wherein the display layer includes:

a first electrode, a second electrode facing the first electrode, and an intermediate layer between the first electrode and the second electrode and including an organic emission layer.

18. The display apparatus as claimed in claim 12, wherein the display layer includes:

a pixel electrode, a common electrode facing the pixel electrode, and a liquid crystal layer between the pixel electrode and the common electrode.

19. The display apparatus as claimed in claim 12, wherein the encapsulation layer is between the light-absorbing layer and the reflective layer.

20. A display apparatus, comprising:

a display layer including a non-emission area and an emission area;

an encapsulation layer over the display layer;

a light-absorbing layer on the encapsulation layer; and a reflective layer disposed on a first surface of the encapsulation layer, the light-absorbing layer being disposed on a second surface of the encapsulation layer opposite the first surface, wherein the reflective layer includes a first opening corresponding to the emission area and a reflecting area adjacent the first opening and corresponding to the non-emission area, wherein the reflective layer is to transmit light in a display mode in which the emission area emits light and to reflect light in a mirror mode, wherein, in the mirror mode, external light is reflected in a direction away from the display layer such that the only reflected light observed by a viewer is light that is external to the display layer and wherein the light-absorbing layer has a second opening planarly overlapping the first opening in the reflective layer corresponding to the emission area, and wherein, in the display mode, the light emitted from the emission area to the outside passes through the second opening of the light-absorbing layer, the encapsulation layer, and the first opening of the reflective layer sequentially.

* * * * *